United States Patent
Amann et al.

(10) Patent No.: US 6,700,469 B2
(45) Date of Patent: Mar. 2, 2004

(54) ACTIVELY SHIELDED SUPERCONDUCTING MAGNET ASSEMBLY WITH IMPROVED FRINGE FIELD COMPENSATION

(75) Inventors: Andreas Amann, Zurich (CH); Robert Schauwecker, Zurich (CH); Pierre-Alain Bovier, Zurich (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 10/456,774

(22) Filed: Jun. 9, 2003

(65) Prior Publication Data

US 2003/0234649 A1 Dec. 25, 2003

(30) Foreign Application Priority Data

Jun. 22, 2002 (DE) .......................................... 102 27 876

(51) Int. Cl.⁷ .............................. H01F 6/00; H01F 7/00
(52) U.S. Cl. ...................................... 335/301; 335/216
(58) Field of Search ........................ 335/216, 296–301; 324/318, 319, 320

(56) References Cited

U.S. PATENT DOCUMENTS 5,329,266 A * 7/1994 Soeldner et al. ............ 335/216
6,265,960 B1   7/2001 Schauwecker et al.

FOREIGN PATENT DOCUMENTS

WO      WO 00/52 490      9/2000

* cited by examiner

Primary Examiner—Ramon M. Barrera
(74) Attorney, Agent, or Firm—Paul Vincent

(57) ABSTRACT

A magnet assembly for generating a magnetic field (H) in the direction of a z axis in a working volume (AV) disposed on the z axis about z=0 with an actively shielded superconducting magnet coil system (M) and at least one current path (P1, . . . , Pn) which is superconductingly closed in the operating state, wherein the actively shielded superconducting magnet coil system (M) comprises a radially inner partial coil system (C1) and a radially outer partial coil system (C2) disposed coaxially with respect to each other and whose magnetic dipole moments have opposite signs in the operating state and differ by an amount $\Delta_m$, with $|\Delta_m|$<2.5% of the magnitude of the magnetic dipole moment of the radially inner partial coil system (C1), is characterized in that the current paths (P1, . . . ,Pn) are at least temporally superconductingly short-circuited during charging of the actively shielded superconducting magnet coil system (M) and that the current paths (P1, . . . , Pn) are designed such that the currents induced therein due to the charging process of the magnet coil system (M) generate an overall magnetic dipole moment of a magnitude of at least 0.1% of the magnitude of the magnetic dipole moment of the charged radially outer partial coil system (C2). Suitable design of the additional current paths compensates for deviations of the fringe field from its design specification, due to deviations of coil parameters from their design values.

15 Claims, 2 Drawing Sheets

ACTIVELY SHIELDED SUPERCONDUCTING MAGNET ASSEMBLY WITH IMPROVED FRINGE FIELD COMPENSATION

This application claims Paris Convention priority of DE 102 27 876.8 filed Jun. 22, 2002 the complete disclosure of which is hereby incorporated by reference.

BACKGROUND OF THE INVENTION

The invention concerns a magnet assembly with an actively shielded superconducting magnet coil system and at least one current path which is superconductingly closed in the operating state, wherein the actively shielded superconducting magnet coil system comprises a radially inner and a radially outer partial coil system which are disposed coaxially to each other and whose magnetic dipole moments have opposite signs in the operating state and differ by an amount $\Delta_m$ with $|\Delta_m|<2.5\%$ of the magnetic dipole moment magnitude of the radially inner partial coil system.

A magnet assembly of this type comprising an actively shielded magnet coil system and at least one additional superconductingly closed current path is disclosed in the patent document U.S. Pat. No. 6,265,960. In this magnet assembly, an additional, superconductingly closed current path acts as a superconducting shim device to improve the field homogeneity in the working volume of the magnet assembly.

Patent document WO 00/52490 discloses a further magnet assembly comprising an actively shielded magnet coil system and at least one additional superconductingly closed current path. This magnet assembly comprises an additional superconductingly closed current path for compensating external electromagnetic disturbances, for compensating a field drift caused by the magnet coil system itself, or for fine adjustment of the magnetic field strength in the working volume.

Superconducting magnets have various fields of application which include high-field applications, e.g. for magnetic resonance methods. Such high-field magnets also typically generate a large fringe field that can represent a danger for the surroundings of the magnet. This problem can be solved when the magnet comprises an active shielding, i.e. an additional superconducting coil that is connected in series with the main coil of the magnet and generates a field of opposite polarity.

In particular for magnets with highly efficient fringe field shielding, deviations in the design specifications of the magnet coils may cause such considerable changes in the fringe field generated by the magnet assembly that the required fringe field specifications are not met. Small deviations from the design specifications due to production tolerances are unavoidable. For example, the wire diameters may have tolerances of up to one percent. Such small deviations can dramatically deteriorate the fringe field values since large field contributions with different signs are mutually superposed to compensate the fringe field outside of the magnet assembly. At a location where a fringe field of 0.5 mT should result, the mutually compensating amounts of main coil and fringe field shielding are e.g. in an order of magnitude of 100 mT. A deviation of one of these two field contributions from its desired value by approximately 1% caused by the production inaccuracies in the coil system therefore produces a deviation of the fringe field strength from the desired value of approximately 1 mT at the location of the 0.5 mT contour surface. The required fringe field limit at this location could thereby be exceeded; in this case by multiple factors.

It is the underlying purpose of the present invention to improve a conventional magnet assembly such that its fringe field boundary values are maintained even when individual parameters of the coil arrangement differ from the desired values in consequence of production inaccuracies. In particular, fringe field effects from deviations in the winding data from their desired values and due to geometrical deviations in the coil formers carrying the individual coil systems from their desired geometry, shall be compensated for.

SUMMARY OF THE INVENTION

This object is achieved in accordance with the invention in that one or more additional current paths can be inductively charged during charging of the actively shielded magnet coil system. Towards this end, these current paths are already superconductingly closed when the actively shielded magnet coil system is charged. The additional current paths are designed such that that the current induced in them during charging of the actively shielded magnet coil system depends on the deviation of the design parameters of the magnet coil system (e.g. wire winding numbers and coil geometry) from their desired values. The inventive inductively charged current paths must also have a sufficiently large area enclosed by their windings so that the induced current can produce a fringe field contribution, in particular a magnetic dipole moment, of sufficient magnitude. Under these conditions, production tolerance related deviations in the magnetic dipole moment of the actively shielded magnet coil system from its desired value can be at least partly compensated for in the operating state of the configuration by the dipole moment of the current induced in the additional superconductingly short-circuited current paths.

The inventive configuration is advantageous in that even for superconducting magnet systems with excellent active shielding whose fringe field reacts excessively to deviations in the design parameters of the magnet coil arrangement from their desired values, the theoretically feasible fringe field limits can be met without having to take expensive and demanding measures to prevent production deviations from the design specifications. This reduces production costs since no additional measures are required during the production process to exactly meet the winding data according to the design specifications and the wires and coil formers do not have to meet particularly narrow tolerances. The inventive configuration is particularly advantageous since deviations in various design parameters of the actively shielded magnet coil system from their desired values do not cause the fringe field limiting value to be exceeded, without having to calculate and construct a special configuration for each individual parameter. In particular, the inventive magnet assembly can be installed without any special procedure, to prevent the configuration to exceed its fringe field limiting values due to production inaccuracies in the magnet assembly.

In one particularly preferred embodiment of the inventive magnet assembly, at least one of the additional superconductingly short-circuited current paths has a non-zero inductive coupling to the radially inner partial coil system and at least one of the additional superconductingly short-circuited current paths has a non-zero inductive coupling to the radially outer partial coil system of the actively shielded superconducting magnet coil system. Without this condition, a deviation in the design parameters of the partial coil systems from their desired values could remain unnoticed by the additional superconductingly short-circuited current paths and the fringe field change due to such a deviation in the design parameters of the partial coil systems from their desired values would remain uncompensated for.

In a particularly preferred embodiment of the inventive magnet assembly, at least one of the additional superconductingly short-circuited current paths is, in total, inductively decoupled from the magnet coil system when the design specifications are met. This is preferably achieved in that, for each of these current paths, the non-vanishing inductive coupling to the radially inner partial coil system is substantially opposite and equal to the inductive coupling to the radially outer partial coil system. This is advantageous in that no current is induced in the additional current paths when the system corresponds exactly to its design specifications. Production deviation of a design parameter from its desired value in one of the two partial coil systems results in an inductive coupling between the magnet coil system and these current paths. The current induced in these current paths during charging of the magnet coil system generates a magnetic field, which compensates for the deviation of the magnetic flux of the magnet assembly from the design value. This condition is required to ensure that the production deviation of the fringe field of the magnet assembly from its desired value is also compensated for.

In a particularly advantageous inventive magnet assembly, the magnetic dipole moments of the partial coil systems of the actively shielded magnet coil system differ by less than 1% of the magnetic dipole moment of the radially inner partial coil system. In this case, the production tolerance related deviations in the dipole moments of the two partial coil systems of the actively shielded magnet coil system are particularly large relative to the overall dipole moment of the magnet coil system. This produces large deviations in the overall dipole moment of the magnet coil system from its theoretical value even for small deviations in the design parameters of the partial coil systems from their desired values. It is therefore advantageous, in particular for such actively shielded magnet coil systems, to provide an inventive device in the form of additional superconductingly short-circuited current paths for compensating deviations in the fringe field of the magnet coil system from its desired value.

One embodiment of the inventive magnet assembly is also particularly advantageous with which the magnet assembly is part of an apparatus for high-resolution magnetic resonance spectroscopy. The radially inner partial coil system of such magnet assemblies generally has a very large dipole moment due to the high field strengths required for such apparatus, and therefore the use of actively shielded magnet systems is particularly advantageous. The inventive configuration ensures that production deviations in the magnet coil system from its design specifications do not result in excessive fringe fields as would be particularly undesirable in this case due to the usual large dipole moments.

In one advantageous embodiment of the inventive magnet assembly, at least one of the additional superconductingly short-circuited current paths comprises a device for limiting the current induced therein. This prevents excessive current from being induced in the additional current path during charging of the actively shielded magnet coil system, which could damage the current path.

In one particularly preferred embodiment of the inventive magnet assembly, a superconducting switch is integrated in at least one of the additional superconductingly closed current paths and the magnet assembly comprises a device for feeding current to this current path. This permits fine adjustment of the fringe field generated by the overall magnet assembly through proper adjustment of the current in this additional current path. Particularly for special applications and locations, fringe field geometries can be obtained for an inventive magnet assembly, which differ from the design specifications without requiring additional means.

In a further advantageous embodiment of the inventive magnet assembly, at least one of the additional superconductingly short-circuited current paths is part of a device that provides the magnet assembly with additional functionality. In particular, that current path serves for compensating external magnetic field fluctuations. This embodiment is advantageous since this double functionality makes the overall magnet assembly more compact.

In a further particularly preferred embodiment of the inventive magnet assembly, at least one of the additional superconductingly short-circuited current paths is thermally decoupled from the actively shielded magnet coil system. In the event of a quench in the magnet coil system, the amount of heat transferred to this additional current path is sufficiently small that a quench in the additional current path is not triggered, at least during the initial phase of the quench. This is important since the current induced in the additional, still superconducting, current path due to the change in the magnetic flux during the initial phase of the quench of the magnet coil system, is needed in order to keep the fringe field of the magnet assembly small during the quench.

In one particularly preferred embodiment of the inventive magnet assembly, at least one of the additional superconductingly closed current paths has magnet coils of a radius, which is at least 90% of the radius of the outermost coils of the actively shielded superconducting magnet coil system. Since this current path surrounds a large surface, it generates a considerable magnetic dipole moment without requiring a large current. This is advantageous since the maximum current that flows in this current path can be easily kept below the critical current above which superconductivity would break down.

One further advantageous embodiment of the inventive magnet assembly is characterized in that at least one of the additional superconductingly closed current paths comprises coils which are wound on a coil former which also carries coils of the outer partial coil system of the actively shielded superconducting magnet coil system. This additional current path thereby surrounds a large surface and therefore requires only a small amount of current to generate a magnetic dipole moment that has sufficient influence on the fringe field. The magnet assembly is less expensive to produce since no additional coil former is required for the additional current path.

In one further advantageous embodiment of the inventive magnet assembly, at least one of the additional superconductingly closed current paths generates an asymmetrical magnetic field in the operating state relative to a plane perpendicular to the z axis and intersecting same at z=0. This embodiment permits correction of deviations in the fringe field of the magnet assembly from its desired behavior, which are asymmetrical relative to this plane. Fringe field distortions of this type can be caused e.g. by superconducting shim coils in the magnet assembly if the shim coils produce a field contribution which can be expanded along the z-axis about z=0 in a polynomial in z with odd coefficients $H_n$.

Further advantages of the invention can be extracted from the description and the drawing. The features mentioned above and below may be used in accordance with the invention either individually or collectively in arbitrary combination. The embodiments shown and described are not to be understood as exhaustive enumeration, but rather have exemplary character for describing the invention.

The invention is shown in the drawing and is explained in more detail with reference to embodiments.

DESCRIPTION OF THE PREFERRED EMBODIMENT

Figure 1:
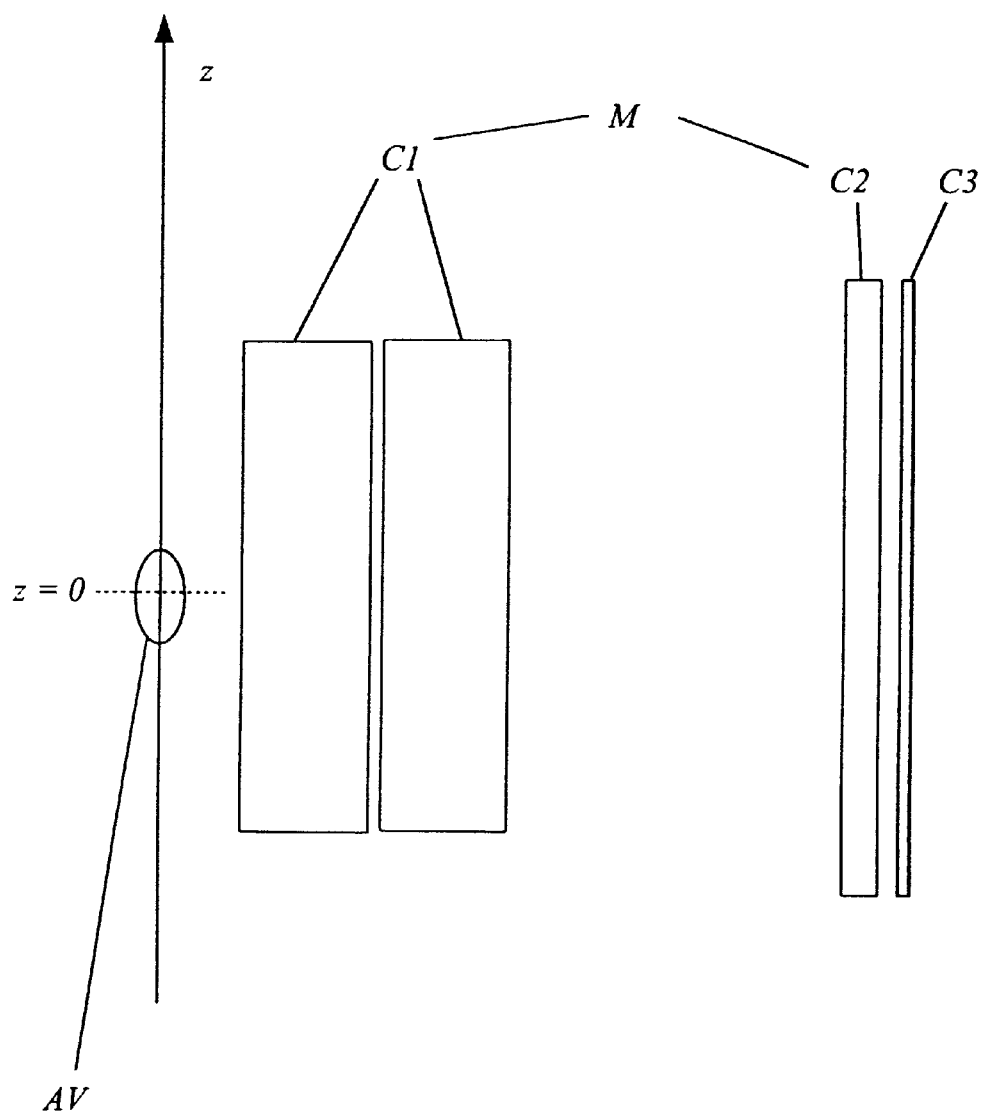
FIG. 1 shows a schematic vertical section through a radial half of an inventive magnet assembly.

FIG. 1 shows an inventive magnet assembly disposed about a working volume AV and comprising an actively shielded superconducting magnet coil system M with a radially inner and a radially outer coaxial partial coil system C1 and C2 and an additional superconductingly closed current path P1 in the form of a further magnet coil system C3.

Figure 2:
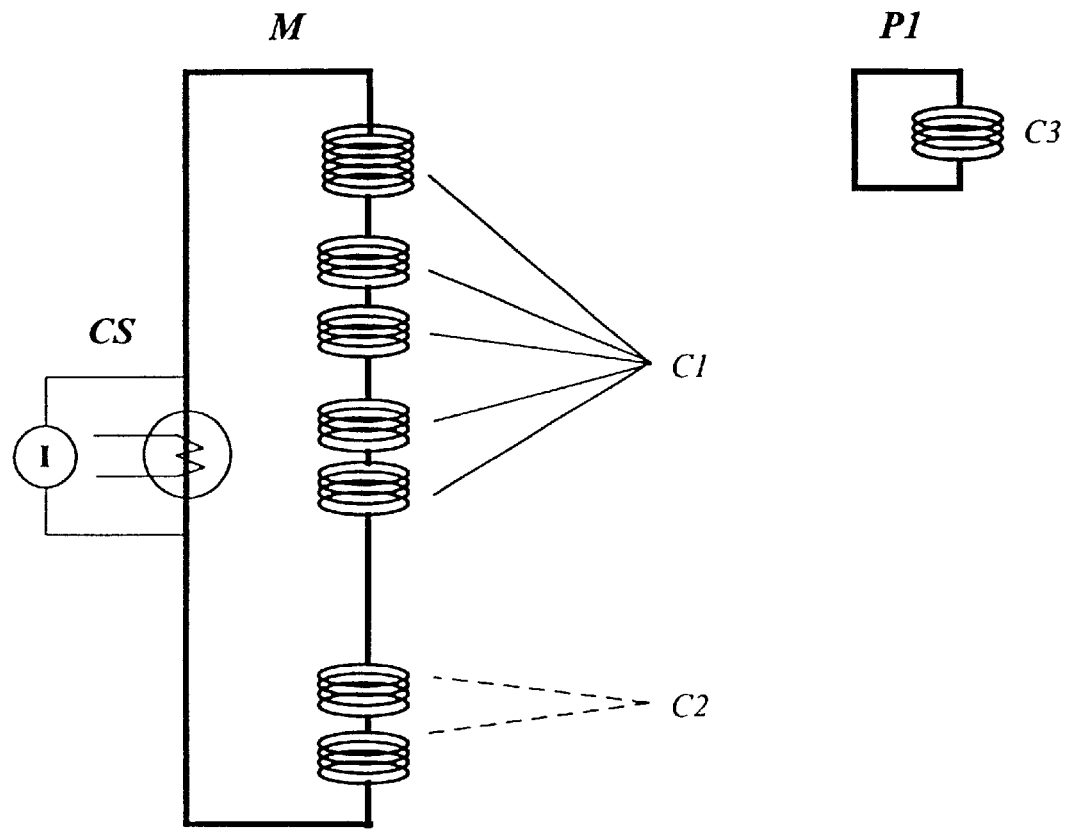
FIG. 2 shows a wiring diagram of an inventive magnet assembly.

FIG. 2 schematically shows the wiring of an inventive magnet assembly, in particular of an additional superconductingly closed current path P1 in the embodiment of an additional coil system C3, which is separate from the actively shielded superconducting magnet coil system M. The magnet coil system M has an external current supply CS.

The invention is explained below by means of two embodiments of a magnet assembly with an actively shielded superconducting magnet coil system, each of the embodiments generating a magnetic field in the working volume AV having a strength of 9T. Niobium-titanium is used as the superconducting material. The magnet assembly is operated in a liquid helium bath at a temperature of 4.2K.

The first magnet assembly (called embodiment "V1" below) comprises an actively shielded superconducting magnet coil system M in accordance with prior art. A radially inner partial coil system C1 and a radially outer partial coil system C2 are part of this magnet coil system. C1 thereby consists of two concentric and coaxial solenoid coils C1a and C1b that are directly wound on each other and have the same polarity and C2 consists of one single solenoid coil which is disposed concentrically and coaxially to C1 with a polarity opposite to that of C1. The operating current for this magnet coil system is 81.7A. The clear inner bore has a diameter of 70 mm.

An inventive variant (referred to as "V2" below) is compared to variant V1 and has, in addition to the magnet coil system M, an additional superconductingly closed current path P1 in the form of a further coil system C3. In the present example, the magnet coil system M is identical to that of variant V1. C3 consists of a two-layered solenoid coil, which is directly wound on the outermost layer of C2.

Table 1 shows the most important features of the partial coil systems C1 (C1a and C1b) and C2 as well as of the additional magnet coil system C3.

TABLE 1

|   | C1a | C1b | C2 | C3 |
|---|---|---|---|---|
| ri [mm] | 38.0 | 58.5 | 222.0 | 225.4 |
| ra [mm] | 58.5 | 102.2 | 225.4 | 226.6 |
| L [mm] | 380 | 380 | 450 | 287 |
| W | 361 | 468 | 698 | 445 |
| N | 26 | 62 | 6 | 2 |
| m* [m²] | 673.4 | 14.7 | −658.7 | 143.0 |

In Table 1:
ri inner radius of the solenoid coil,
ra outer radius of the solenoid coil,
L length of the solenoid coil,
W the number of wire windings on each layer of the solenoid coil,
N the number of wire layers of the solenoid coil,
m* the magnetic dipole moment per ampere current.

The influence of deviations in the individual magnet coils from the design specifications on the fringe field of the configuration in the operating state is calculated below for the magnet assemblies V1 and V2. Herein, an example for a possible deviation of a design parameter from its desired value is an increase in the wire windings of the partial coil system C2 compared to the theoretical value due to a superconducting wire having a diameter smaller than its desired value.

To calculate the current induced in C3, we require the inductance matrix of the described configuration. For a configuration, which was produced precisely according to the design specifications for the examples V1 or V2, it is calculated as follows:

$$L_{Design}\begin{bmatrix} L_{C1} & L_{C1 \leftrightarrow C2} & L_{C1 \leftrightarrow C3} \\ L_{C1 \leftrightarrow C2} & L_{C2} & L_{C2 \leftrightarrow C3} \\ L_{C1 \leftrightarrow C3} & L_{C2 \leftrightarrow C3} & L_{C3} \end{bmatrix} = \begin{bmatrix} 51.67H & -5.15H & 1.21H \\ -5.15H & 5.28H & -1.21H \\ 1.21H & -1.21H & 0.32H \end{bmatrix},$$

wherein the matrix elements, which describe couplings to C3, are relevant only for the embodiment V2. As can be gathered from the above-mentioned values, in the embodiment V2 in accordance with the design specifications, the magnet coil system M is, in total, inductively decoupled from the magnet coil system C3 ($L_{C1 \leftrightarrow C3} + L_{C2 \leftrightarrow C3} = 0$). C3 has a relatively strong coupling to each of the partial coil systems C1 and C2.

The magnet coil system M has a fringe field which can be characterized e.g. by the maximum extension of the 0.5 mT contour surface. In an embodiment of the magnet coil system M in accordance with the design specifications, this extension is 0.63 m in a radial and 1.09 m in an axial direction. The use of a wire in the partial coil system C2 whose diameter is smaller than the specified values by 4% causes this partial coil system to have 727 instead of 698 windings per layer and considerably increases the radial extension of the 0.5 mT contour surface for variant V1. This is compensated for in the inventive magnet assembly V2 in that a current is induced in the additional magnet coil system C3 due to the inductive coupling to the partial coil system C2 that differs from the design value, to practically completely compensate for the deviation of the fringe field from the desired value. The additional wire windings in the partial coil system C2 increase the inductive coupling $L_{C2 \leftrightarrow C3}$ up to −1.26H. The overall magnet coil system C3 is thereby no longer inductively decoupled from the magnet coil system M. This inductive coupling induces a current of 12.5A in the magnet coil system C3 through charging of the magnet coil system M to its desired current (which is now 82.0A due to the higher winding number in C2).

Table 2 shows the resulting dipole moments in the operating state and the dimensions of the 0.5 mT contour surface for the two embodiments V1 and V2 in accordance with the design specifications and for a wire, which is 4% too thin in the partial coil system C2.

TABLE 2

|  | According to design | Winding deviations in C2 | |
|---|---|---|---|
|  | V1 & V2 | V1 | V2 |
| R5G [m] | 0.63 | 0.80 | 0.64 |
| Z5G [m] | 1.09 | 0.92 | 1.05 |
| B63 [mT] | 0.50 | 1.26 | 0.55 |
| $m_{C1}$ [Am$^2$] | 55051 | 55225 | 55225 |
| $m_{C2}$ [Am$^2$] | −53850 | −56236 | −56236 |
| $m_M$ [Am$^2$] | 1201 | −1011 | −1011 |
| $m_{C3}$ [Am$^2$] | 0 | — | 1789 |

In Table 2:

R5G maximum extension of the 0.5 mT contour surface in a radial direction, measured from the magnet axis, Z5G maximum extension of the 0.5 mT contour surface in an axial direction, measured from the magnet center plane, B63 maximum magnitude of the field strength of the magnet assembly on a cylindrical surface coaxial with the magnet coil system having a radius of 0.63 m, $m_{C1}$ magnetic dipole moment of the partial coil system C1 in the operating state, $m_{C2}$ magnetic dipole moment of the partial coil system C2 in the operating state, $m_M$ magnetic dipole moment of the magnet coil system M in the operating state, $m_{C3}$ magnetic dipole moment of the additional partial coil system C3 in the operating state.

As can be seen from the values of table 2, the deviation of the winding data from the design specifications causes a clear change in the magnetic dipole moment of the partial coil system C2. This change is largely compensated for in the inventive embodiment V2 by the magnetic dipole moment that is generated by the current induced in the magnet coil system C3 to generate a fringe field, which is practically identical to the design. Table 2 also shows that a magnet coil system M that is optimized with regard to the minimum radial extension of the 0.5 mT contour surface does not have a minimum magnetic dipole moment. For the assumed winding number deviations in the partial coil system C2, variant V1 obtains a smaller magnetic dipole moment than according to the design specifications. However, the extension of the 0.5 mT contour surface in a radial direction is considerably larger than the design specifications. In the inventive embodiment V2, the current induced in the additional coil system C3 minimizes the radial extension of the 0.5 mT contour surface, although the magnitude of the resulting total dipole moment thereby increases.

The region inside the R5G distance from the magnet axis must typically be kept free from magnetic materials and from devices that are sensitive to magnetic fields. This distance is 0.63 m for a configuration in accordance with the design specifications. For this reason, it is crucial that the field strength of 0.5 mT is not exceeded at this distance from the magnet axis even when individual coil parameters have values, which differ from the desired value. This requirement is not met in the embodiment V1. The fringe field may rise at a distance of 0.63 m from the magnet axis up to twice the design value of 0.5 mT and the threshold value of 0.5 mT is only achieved beyond a distance from the magnet axis of 0.80 m. In contrast thereto, the inventive variant V2 shows no fringe field increase compared to the design values.

The fringe field of the magnet coil system M in the above example is optimized with regard to minimum radial extension of the 0.5 mT contour surface. Due to production deviations of individual coil parameters from their design specifications, the embodiment of the magnet assembly from the above-mentioned example according to prior art, shows a reduction in the axial extension of the 0.5 mT contour surface relative to the desired value. This is always accompanied by an increase in the radial extension of the 0.5 mT contour surface (shown in the example of table 2). In an inventive embodiment of the magnet assembly, the influence of production deviations of individual coil parameters from their design specifications on the fringe field can be largely eliminated. The fringe field values of the magnet assembly aimed for in the design can always be maintained irrespective of production tolerances of some coil parameters. In an inventive magnet assembly always those fringe field criteria remain optimized which are intended to be optimized by the design—irrespective of production tolerances of certain coil parameters.

We claim:

1. A magnet system for generating a magnetic field (H) in the direction of a z axis in a working volume (AV) disposed on the z axis about z=0, the system comprising:

a radially inner partial coil system (C1);

a radially outer partial coil system (C2) disposed coaxially with respect to said radially inner coil system, said radially inner and outer coil systems having magnetic dipole moments in an operating state of opposite signs and differing by an amount $\Delta_m$, with $|\Delta_m|<2.5\%$ of a magnitude of a magnetic dipole moment of said radially inner partial coil system (C1), said radially inner and outer coil systems being parts of an actively shielded superconducting magnet coil system (M); and at least one current path (P1, ..., Pn) which is superconductingly closed in the operating state, wherein said at least one current paths (P1, ..., Pn) are, at least at certain times, superconductingly short-circuited during charging of said actively shielded superconducting magnet coil system (M), wherein said current paths (P1, ..., Pn) are designed such that currents induced therein due to charging of said magnet coil system (M) generate an overall magnetic dipole moment of a magnitude of at least 0.1% of a magnitude of a magnetic dipole moment of a charged said radially outer partial coil system (C2) to optimize fringe field behavior outside of the magnet system.

2. The magnet system of claim 1, wherein at least one ($Pj_1$, ..., $Pj_m$) of said current paths (P1, ..., Pn) has a non-zero inductive coupling $L_{C1 \leftrightarrows Pj_1}, \ldots, L_{C1 \leftrightarrows Pj_m}$ to said inner partial coil system (C1) and at least one ($Pk_1$, ..., $Pk_p$) of said current paths (P1, ..., Pn) has a non-zero inductive coupling $L_{C2 \leftrightarrows Pk_1}, \ldots, L_{C2 \leftrightarrows Pk_p}$ to said outer partial coil system (C2) of said actively shielded superconducting magnet coil system (M).

3. The magnet system of claim 2, wherein associated coupling coefficients $$K_{1,j_1} = \frac{L_{C1 \leftrightarrow Pj_1}}{\sqrt{L_{C1}L_{Pj_1}}}, \ldots, K_{1,j_m} = \frac{L_{C1 \leftrightarrow Pj_m}}{\sqrt{L_{C1}L_{Pj_m}}}$$

are larger than 0.01 and $$K_{2,k_1} = \frac{L_{C2 \leftrightarrow Pk_1}}{\sqrt{L_{C2}L_{Pk_1}}}, \ldots, K_{2,k_p} = \frac{L_{C2 \leftrightarrow Pk_p}}{\sqrt{L_{C2}L_{Pk_p}}}$$

smaller than −0.01, wherein $L_{C1}$, $L_{C2}$, $L_{Pj_1}$, ..., $L_{Pj_m}$ and $L_{Pk_1}$, ..., $L_{Pk_p}$ designate inductances of said inner and outer partial coil systems (C1) and (C2) of said actively shielded superconducting magnet coil system (M) and self inductances of said current paths ($Pj_1$, ..., $Pj_m$) and ($Pk_1$, ..., $Pk_p$).

4. The magnet system of claim 1, wherein said inner and outer partial coil systems (C1) and (C2) and said current paths (P1, ..., Pn) are designed such that a number and position of wire windings is selected to substantially inductively decouple at least one ($Pi_1$, ..., $Pi_q$) of said current paths (P1, ..., Pn) from said actively shielded superconducting magnet coil system (M).

5. The magnet system of claim 4, wherein for each of said current paths ($Pi_1$, ..., $Pi_q$), an inductive coupling to said inner coil system (C1) is substantially opposite and equal to an inductive coupling to said outer coil system (C2).

6. The magnet system of claim 1, wherein $|\Delta_m|<1\%$ of a magnitude of a magnetic dipole moment of said inner partial coil system (C1).

7. The magnet system of claim 1, wherein said magnet system is part of an apparatus for high-resolution magnetic resonance spectroscopy.

8. The magnet system of claim 1, wherein at least one of said current paths (P1, ..., Pn) comprises a device for limiting an induced current.

9. The magnet system of claim 1, wherein at least one of said current paths (P1, ..., Pn) is bridged by a superconducting switch and said magnet system comprises a means for supplying current to said at least one bridged current path.

10. The magnet system of claim 1, wherein at least one of said superconductingly short-circuited current paths (P1, ..., Pn) is part of a device which compensates for external magnetic field fluctuations in an operating state of the magnet system.

11. The magnet system of claim 1, wherein at least one of said current paths (P1, ..., Pn) is thermally decoupled from said actively shielded superconducting magnet coil system (M).

12. The magnet system of claim 11, wherein an amount of heat transferred to said thermally decoupled current path in case of a quench of said actively shielded superconducting magnet coil system (M) is not more than fifty percent of an amount of heat required to trigger a quench in said decoupled current path.

13. The magnet system of claim 1, wherein at least one of said current paths (P1, ..., Pn) comprises magnet coils having a radius which is at least 90% of a radius of outermost coils of said actively shielded superconducting magnet coil system (M).

14. The magnet system of claim 1, wherein at least one of said current paths (P1, ..., Pn) comprises coils which are wound on a coil support, said coil support also bearing coils of said outer partial coil system (C2) of said actively shielded superconducting magnet coil system (M).

15. The magnet system of claim 1, wherein at least one of said current paths (P1, ..., Pn) generates a magnetic field in an operating state which is asymmetric relative to a plane perpendicular to the z axis and intersecting that axis at z=0.

* * * * *